July 9, 1968 W. G. REIMANN ET AL 3,391,454

SHIELDED ETCHED CIRCUIT CONDUCTOR

Filed March 10, 1965 2 Sheets-Sheet 1

INVENTORS
William G. Reimann
Joseph Simon

By Ralph M Braunstein
Attorney

SHIELDED ETCHED CIRCUIT CONDUCTOR

Filed March 10, 1965 2 Sheets-Sheet 2

INVENTORS
William G. Reimann
Joseph Simon

By Ralph M. Braunstein
Attorney 3,391,454
SHIELDED ETCHED CIRCUIT CONDUCTOR
William G. Reimann, Los Angeles, and Joseph Simon, North Hollywood, Calif., assignors to Litton Systems, Inc., Woodland Hills, Calif.
Filed Mar. 10, 1965, Ser. No. 438,521
14 Claims. (Cl. 29—625)

ABSTRACT OF THE DISCLOSURE

A process for forming a completely shielded circuit conductor in which the circuit conductor and the shielding surrounding it are formed by the provision of conducting and insulating layers of material and the selective removal of portions thereof.

This invention relates to shielded printed or etched circuit conductors and to processes for fabricating them.

Much effort is presently being directed to advancing the state of the electronics art through miniaturization. Developments such as module and chip utilization, and multilayer laminates are all directed toward achieving ever smaller and more compact electronic assemblies. Size reduction, however, inevitably aggravates already severe "noise" problems in sensitive circuits. Undesired coupling or "cross-talk" is invariably a limiting factor in the design of miniaturized circuits.

Cross-talk problems are likely to be especially severe in digital systems. For example, a Fourier analysis of a typical digital pulse will reveal a substantial noise content extending well into the UHF portion of the spectrum. This characteristic places severe restrictions on the packaging and/or routing of digital circuits in close proximity to sensitive electronic circuits or components.

The sensitivity of many circuits to cross-talk can be controlled or substantially eliminated by adequate shielding. In multilayer laminated circuits of the prior art, shielded conductors have been simulated by placing parallel grounded conductors in the same plane on either side of, and in other planes above and below, the signal conductor. Arrangements of this type not only require a relatively large amount of space (being three conductors wide and three full layers high) which is at a premium where miniaturization is a goal, but suffer in addition from the fact that the shield is non-continuous and, therefore, only partially effective. This becomes an increasingly serious disadvantage as the art progresses to ever higher frequencies and ever shorter pulse rise times.

An object of this invention is to provide a substantially continuously shielded conductor in a multilayer laminated circuit.

In one illustrative embodiment the objects of the invention are achieved by forming in a conductive layer a shallow channel somewhat wider than the width of the signal conductor. The channel is then filled with insulating material and the signal conductor, of lesser width, is deposited thereon. Additional conductive material is then deposited on the initial layer to form a channel around the signal conductor. This channel, the sides of which extend somewhat above the level of the signal conductor, is then filled with insulating material. Finally, the entire structure is plated with another conductive layer. The resulting cross-section comprises the signal conductor entirely surrounded by an insulating layer which in turn is surrounded by a conductive layer forming a continuous shield.

The objects, features and advantages of the invention will be fully understood from the following detailed discussion taken in conjunction with the accompanying drawing, in which.

Figure 1:
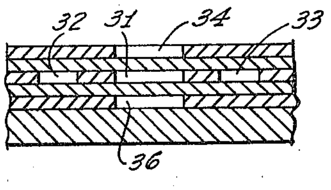
Fig. 1 (Prior Art)
FIG. 1 depicts a cross-section of a simulated shielded conductor of a prior art etched or printed circuit.

FIG. 1 shows a cross-section of a typical prior art printed or etched circuit in which a shielded conductor is simulated by a signal conductor 31 flanked on either side by parallel conductors 32 and 33 and by conductors 34 and 36 in planes above and below, which, when connected to ground, partially shield the center conductor. While an arrangement such as that illustrated in FIG. 1 provides a substantial amount of shielding, the shield is not continuous. The signal conductor 31, therefore, is relatively exposed to interference from high frequency signals such as are commonly found in digital circuits as well as in other systems employing laminated or miniaturized circuitry. Since the conductors 34 and 36 each occupy a full plane of the laminate, structures such as that shown in FIG. 1 require a large amount of space to provide an inadequate amount of shielding. Furthermore, they necessitate the preparation of a number of conductor patterns, or as they are commonly known, pieces of art work, thereby increasing the expense of the design and complexity of the manufacturing process.

Figure 13:
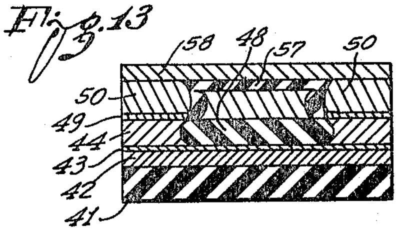

In a preferred embodiment of the present invention, however, a laminated structure having a cross-section as depicted in FIG. 13 is produced by a process employing but a single pattern to define the areas occupied respectively by the signal conductor, the surrounding insulation and the continuous conductive shield. In addition to requiring a single piece of conductor art work to form both the signal conductor and its insulator, the method of the invention produces a completely shielded conductor which is entirely encompassed in a single etched circuit lamina.

Figure 2:
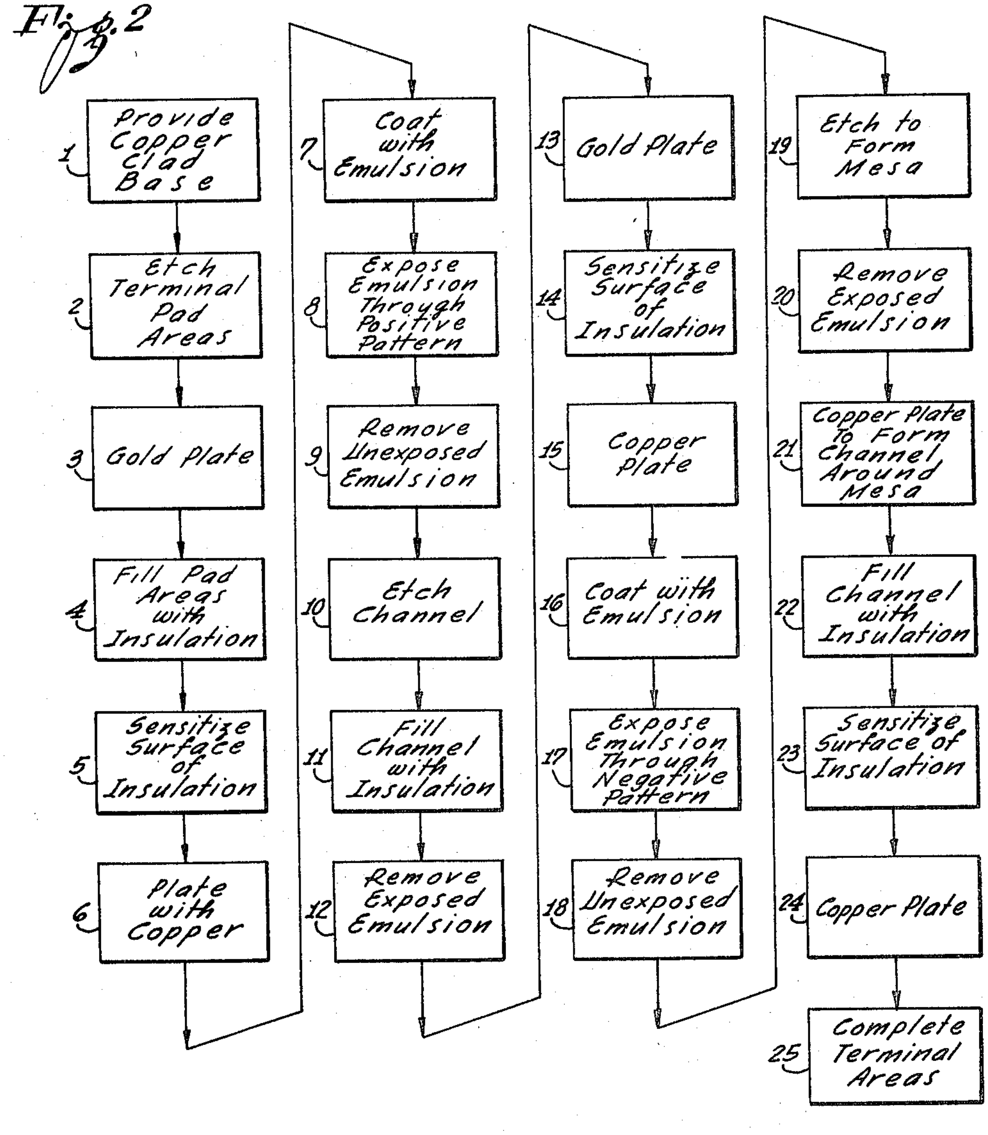
FIG. 2 is a diagrammatic flow chart illustrating the steps of the process of the invention.

In a preferred illustrative embodiment, the method of the invention comprises some 25 steps as represented by the flow chart of FIG. 2. As step 1, there is provided a copper clad insulating base which may be of plastic, fiberglass or any other substrate deemed appropriate in view of the ultimate intended use of the circuit. The copper foil cladding forms a first continuous conductive layer. In a typical example the thickness of the first conductive layer may be about 1.35 mils. As step 2 of the process, a terminal pad pattern is etched into the first conductive layer to remove the copper cladding from the areas of the substrate underlying the termination areas of the conductor pattern to be formed subsequently. The surface of the conductive layer is next lightly plated with gold to form a first continuous etch-resistant layer. The amount of gold deposited in this third step of the process is advantageously about $10^{-5}$ inch. In step 4 the etched pad areas are filled with electrical insulation which may be a suitable plastic known in this art. The surface of the insulation is then sensitized to make it electrically conductive and copper plated on this surface and on the etch-resistant layer to form a second continuous conductive layer which is in substantially continuous electrical contact with the first conductive layer. The thickness of the second conductive layer is advantageously about 5–10 mils. The entire surface of the second conductive layer is next, as step 7, coated with a photosensitive etch-resistant layer which may be, for example, any one of the known photo-engraving emulsions commonly used in this art.

Figure 3:
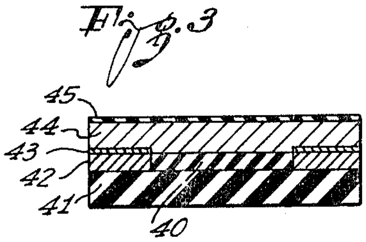
FIGS. 3 through 14 depict an etched or printed circuit of the invention at various stages of the process shown in FIG. 2.

FIG. 3 shows, in cross-section, insulating base 41, first conductive layer 42 with terminal pad 40, first etch-resistant layer 43, second conductive layer 44, and photosensitive emulsion layer 45.

Figure 4:
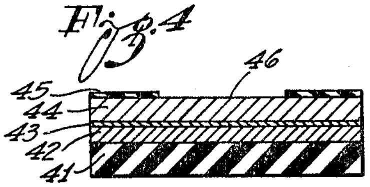

The photosensitive emulsion of layer 45 is exposed, in step 8, through a positive image of the desired conductor pattern. That is, a portion of the emulsion peripheral to the area corresponding to the signal conductor is exposed, while that portion covering the surface areas of conductive layer 44 corresponding to the signal conductor are shielded from the light source and remain unexposed. In step 9 the unexposed emulsion is removed so that the underlying surface area 46 of conductive layer 44 is exposed for etching while the remainder of the surface of layer 44 is protected by the exposed etch-resistant emulsion of layer 45. The multi-layer structure at this stage of the process is illustrated in FIG. 4 which is a cross-section taken through a portion removed from a terminal area.

A problem encountered in many etching processes arises from the fact that an etchant will normally attack an ordinary material in substantially all directions. Thus, if an effort is made to etch a very thin line, it will be found that the etchant tends to widen the line almost as rapidly as it deepens it. Such action is described by an etch factor which is the ratio of the rate at which the line is deepened to the rate at which it is widened. In the absence of special techniques the etch factor is likely to be 1:1. For precision etching of intricate patterns, however, a high etch factor is considered desirable, and factors as high as 30:1 are commonly achieved through the application of special techniques. When an etchant narrows a conductor or widens a groove to the point where it removes metal from beneath the overlying etch-resistant mask, the pattern is said to be undercut. Undercut, normally considered a difficulty to be anticipated when preparing artwork, is employed in the illustrative embodiment of the invention to avoid the need for separate pieces of artwork for the signal conductor and the surrounding conductive shield.

Figure 5:
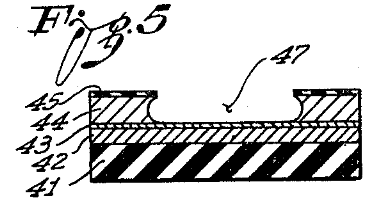

As the 10th step of the process of FIG. 2, a shallow channel 47, shown in FIG. 5, is formed by etching the exposed area 46 of conductive layer 44. The etchant is prevented from penetrating the underlying conductive layer 42 by the etch-resistant layer 43. Because of undercut the channel 47 will be somewhat wider than the eventual width of the signal conductor.

Figure 6:
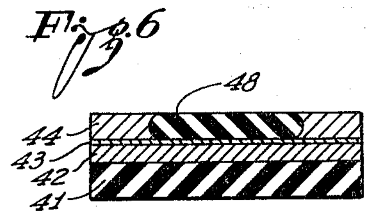
Figure 7:
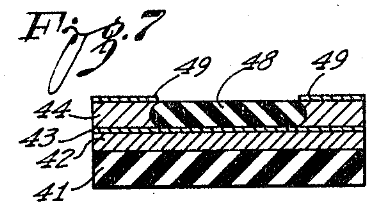
Figure 8:
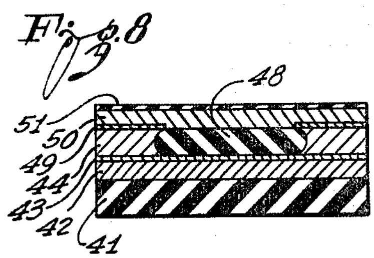

In step 11 channel 47 is filled with insulating material 48 to form the structure shown in FIG. 6. The exposed portion of emulsion layer 45 may then be removed as step 12. The surface of the second conductive layer 44 is coated in step 13 with a thin gold film to form an etch-resistant layer 49 as shown in FIG. 7. The surface of the insulating material 48 is next, as step 14, sensitized so that it will accept a conductive coating 50 which is deposited in accordance with step 15. A typical thickness for this initial portion of conductive layer 50 is 2 mils. In step 16 the surface of layer 50 is coated with a photosensitive etch-resistant emulsion 51 to form the structure shown in FIG. 8.

In the next phase of the process, commencing with step number 17, the signal conductor is formed on the insulating base formed by the material 48 in channel 47.

Figure 9:
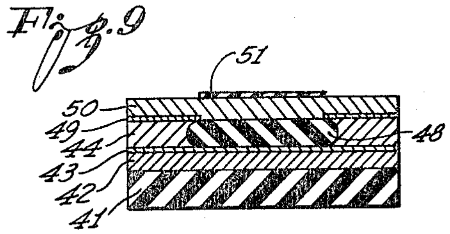

In step 17 the second emulsion layer 51 is exposed through a negative image of the same conductor pattern through which the emulsion layer 45 was exposed in step 8. The negative image is substantially in register with the previous positive image. Thus, portions of the layer 51 corresponding to the unexposed portions of layer 45 are exposed in step 17, while areas corresponding to exposed portions of layer 45 remain unexposed in layer 51. Following exposure, the unexposed portion of emulsion layer 51 are removed as step 18 to bare the underlying areas of the third conductive layer 50 as shown in FIG. 9.

Figure 10:
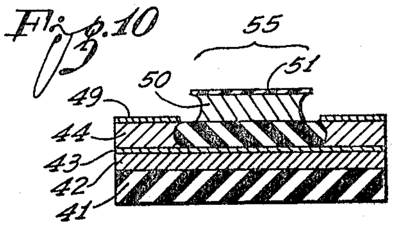

The unprotected area of layer 50 is etched as step 19, the etchant being prevented from attacking the underlying portion of conductive layer 44 by the etch-resistant layer 49. The exposed portion of emulsion layer 51 protects the underlying portion of conductive layer 50 corresponding to the signal conductor. However, due to the etching, the protective emulsion is undercut at the edges so that a conductive mesa 55 is formed as shown in FIG. 10. Mesa 55 corresponds to the signal conductor of the pattern but is of a somewhat lesser width. Thus the effect of a reduced piece of artwork is achieved by etching. As substantially all of the layer 50 above a peripheral portion 52 of the insulating material 48 is removed by the etchant, mesa 55 is substantially electrically isolated from the rest of the structure, and in particular from conductive layers 42 and 44. The exposed emulsion of layer 51 may now be removed from the top of mesa 55. This is step 20.

Figure 11:
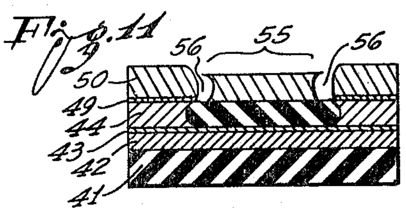

A channel 56 is formed around the conductive mesa 55 by step 21 which comprises plating the surface of layer 49 with copper, thereby reforming some portions of the third conductive layer 50 which were etchced away in step 16. The reforming operation of step 21 is continued to increase the thickness of the layer 50 beyond that of the portion forming mesa 55. Thus the outer walls of channel 56 extend above the surface of mesa 55 as shown in FIG. 11.

Figure 12:
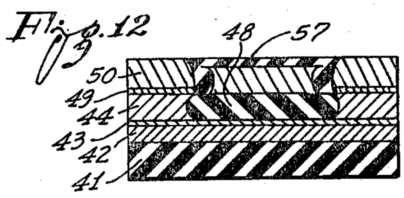

In step 22, channel 56 is filled with an insulating material 57 similar to the material 48 used in filling channel 47. This completes an insulating layer around signal conductor formed by conductive mesa 55. The resultant structure is shown in FIG. 12. The surface of the insulating material in channel 56 is then sensitized, as step 23, to receive a conductive layer. As the penultimate step 24 of the process, a conductive layer 58 is plated on the exposed surface of conductive layer 50 and the sensitized surface of the insulating material 57. The final conductive layer 58 completes a conductive shield which entirely surrounds the signal conductor 55. The completed structure is shown in FIG. 13.

Figure 14:
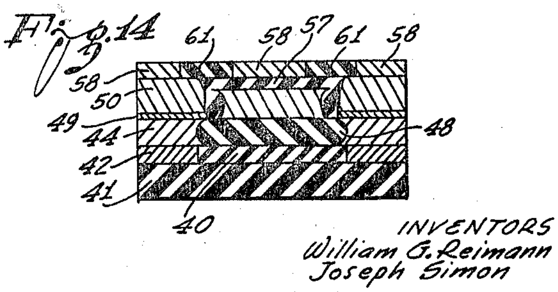

To complete the terminal areas, a pad or, alternatively, a ring formation is etched in the final conductive layer 58 above the pads etched in first conductive layer 42. The etched pad or ring is filled with insulation. This completes step 25. A cross-section of the resultant structure in the terminal areas is shown in FIG. 14. The advantage of such a formation is that a hole may be drilled through the signal conductor in the terminal region without passing the drill through any part of the shield. The inner surface of the hole is advantageously sensitized and plated with copper and a suitable connector may be welded or soldered into the hole in accordance with the usual practice.

In some instances it may be desirable to form an extra thick insulation layer above and below the signal conductor. Formation of the thick layer below the signal conductor presents no unusual problems. However, in forming the channel 56 around the conductive mesa 55 some difficulty may be encountered due to the tendency of the channel to grow narrower or plate up as the thickness of the peripheral portion of conductive layer 50 is built up. This problem may be solved by stopping step 18 when the thickness of that portion of layer 50 has increased a small amount beyond the thickness of mesa 55 and filling the resultant channel with insulating material. The surface of the insulating material is then sensitized, the surface of layer 50 is gold plated and a conductive layer is formed thereon and on the surface of the insulating material. Next a photosensitive emulsion layer is applied and exposed to a positive image of the conductor pattern. The unexposed emulsion is removed and the exposed surface is etched to form a shallow channel of the desired width. The channel is in turn filled with insulating material, its surface sensitized and a final conductive layer applied to the structure. The appropriate terminal area is then formed in the final layer.

Many other variations and modifications of the invention are possible and may be made by those skilled in the art without departing from its scope and spirit. For example, materials other than copper and gold may be used. Additionally, the etch-resistant masks employed in the process may be formed in any convenient manner known in the art. Negative as well as positive printed circuit techniques may also be used. Still other possibilities will be apparent to those familiar with the field of the invention.

What is claimed is:

1. Process of making a shielded etched circuit conductor comprising the steps of coating an insulating base member with copper to form a continuous first conductive layer, coating said first copper layer with gold to form a continuous first etch-resistant layer, coating said first gold layer with copper to form a continuous second conductive layer, coating said second conductive layer with photoengraving emulsion to form a first emulsion layer, exposing said first emulsion layer through a positive image of a shielded conductor pattern, removing the unexposed emulsion of said first emulsion layer to uncover the portions of said second conductive layer corresponding to the shielded conductor of said pattern, over-etching the uncovered area of said second conductive layer to produce a first channel substanitally wider than said area, removing the exposed emulsion of said first emulsion layer, filling said first channel with an etch-resistant insulating material, coating said second conductive layer with gold to form a second etch-resistant layer, sensitizing the surface of the insulating material in said channel, coating said second etch-resistant layer and said sensitized surface with copper to form a continuous third conductive layer, coating said third conductive layer with a photoengraving emulsion to form a second emulsion layer, exposing said second emulsion layer through a negative image of said shielded conductor pattern, said negative image being substantially in register with said positive image, removing the unexposed emulsion of said second emulsion layer to uncover the portions of said third conductive layer corresponding to areas peripheral to the shielded conductor of said pattern, over-etching the uncovered area to remove said third conductive layer above a peripheral portion of said insulating material in said first channel, leaving a conductive mesa substantially narrower than said area, removing the exposed emulsion of said second emulsion layer, coating the exposed conductive surface peripheral to the insulating material in said first channel with copper to reform said third conductive layer and to increase the thickness of said layer beyond that of the portion forming said mesa, forming a second channel between said layer and said mesa, filling said second channel and the area above said mesa and between said reformed third conductive layer with an insulating material, sensitizing the suface of the last recited insulating material, and coating said reformed third conductive layer and said sensitized surface with copper to form a continuous fourth conductive layer.

2. Process of making a shielded etched circuit conductor comprising the steps of providing an insulating base member having a continuous first conductive layer thereon, coating said first conductive layer to form a continuous first etch-resistant conductive layer thereon, coating said first etch-resistant conductive layer to form a continuous second conductive layer thereon, coating said second conductive layer with photoengraving emulsion to form a first emulsion layer thereon, exposing said first emulsion layer through a positive image of a shielded conductor pattern, removing the unexposed emulsion of said first emulsion layer to uncover the portions of said second conductive layer corresponding to the shielded conductor of said pattern, over-etching the uncovered area of said second conductive layer to produce a first channel substanitally wider than said area, removing the exposed emulsion of said first emulsion layer, filling said first channel with an etch-resistant insulating material, coating said second conductive layer to form a second etch-resistant conductive layer thereon, sensitizing the surface of the insulating material in said channel, coating said second etch-resistant conductive layer and said sensitized surface to form a continuous third conductive layer thereon, coating said third conductive layer with a photoengraving emulsion to form a second emulsion layer thereon, exposing said second emulsion layer through a negative image of said shielded conductor pattern, said negative image being substantially in register with said positive image, removing the unexposed emulsion of said second emulsion layer to uncover said third conductive layer, over-etching the uncovered area to remove said third conductive layer above a peripheral portion of said insulating matreial in said first channel, leaving a conductive mesa substantially narrower than said area, removing the exposed emulsion of said second emulsion layer, coating the exposed conductive surface peripheral to the insulating material in said first channel to reform said third conductive layer and to increase the thickness of said layer beyond that of the portion forming said mesa, forming a second channel between said layer and said mesa, filling said second channel and the area above said mesa and between said reformed third conductive layer with an insulating material, sensitizing the surface of the last recited insulating material, and coating said reformed third conductive layer and said sensitized surface to form a continuous fourth conductive layer thereon.

3. Process of making a shielded etched circuit conductor comprising the steps of providing an insulating base member having a continuous first conductive layer thereon, coating said first conductive layer with a continuous first etch-resistant conductive layer, coating said first etch-resistant layer with a continuous second conductive layer in substantially continuous electrical contact with said first conductive layer, coating said second conductive layer with photoengraving emulsion to form a first emulsion layer, exposing a portion of said first emulsion layer peripheral to a shielded conductor pattern, removing the unexposed emulsion of said first emulsion layer to uncover the portion of said second conductive layer corresponding to the shielded conductor of said pattern, over-etching the uncovered area of said second conructor layer to produce a first channel substantially wider than said conductor, removing the exposed emulsion of said first emulsion layer, filling said first channel with an etch-resistant insulating material to form an inuslating base for said conductor, coating said second conductive layer with a second etch-resistant conductive layer, sensitizing the surface of the insulating material in said channel, coating said second etch-resistant layer and said sensitized surface with a continuous third conductive layer in substantially continuous electrical contact with said second conductive layer, coating said third conductive layer with a photoengraving emulsion to form a second emulsion layer, exposing a portion of said second emulsion layer corresponding to the shielded conductor of said pattern, removing the unexposed emulsion of said second emulsion layer to uncover the portion of said third conductive layer surrounding the shielded conductor of said pattern, over-etching the uncovered area to remove said third conductive layer above said material in said channel, leaving a conductive mesa substantially narrower than said area and corresponding to said shielded conductor, removing the exposed emulsion of said second emulsion layer, coating the exposed conductive surface peripheral to said first channel to reform said third conductive layer and to increase the thickness of said layer beyond that of the portion forming said mesa, forming a second channel between said layer and said mesa, filling said second channel and the area above said mesa and between said reformed third conductive layer, with an insulating material to form an insulating wall around and over said shielded conductor, sensitizing the surface of the last recited insulating material, and coating said reformed third conductive layer and said sensitized surface with a continuous fourth conductive layer in substantially continuous electrical contact with said third conductive layer to complete a substantially continuous conductive shield around and insulated from said shielded conductor.

4. Process of making a shielded etched circuit conductor comprising the steps of providing a multilayer laminated structure having a base member, a continuous first conductive layer on said base member, a continuous first etch-resistant conductive layer on said first conductive layer, a continuous second conductive layer on said first etch-resistant layer, and a first photosensitive etch-resistant layer on said second conductive layer, exposing said first photosensitive layer through a positive image of a shielded conductor pattern, romoving the unexposed portion of said first photosensitive layer to uncover the portions of said second conductive layer corresponding to the shielded conductor of said pattern, over-etching the uncovered area of said second conductive layer to produce a first channel substantially wider than said conductor, removing the exposed portion of said first photosensitive layer, filling said first channel with an etch-resistant insulating material to form an insulating base for a narrower shielded conductor, forming a second etch-resistant conductive layer on said second conductive layer, forming a continuous third conductive layer on said second etch-resistant layer and the surfaces of the insulating material in said first channel, forming a second photosensitive etch-resistant layer on said third conductive layer, exposing said second photosensitive layer through a negative image of said shielded conductor pattern, said negative image being substantially in register with said positive image, removing the unexposed portion of said second photosensitive layer to uncover a portion of said third conductive layer corresponding to areas peripheral to said shielded conductor, etching the uncovered area to remove a peripheral portion of said third conductive layer above said insulating material in said channel, leaving a conductive mesa substantially narrower than said area, removing the exposed portion of said second photosensitive layer, coating the exposed conductive surface peripheral to said first channel to reform said third conductive layer and to increase the thickness of said layer beyond that of the portion forming said mesa, forming a second channel between said layer and said mesa, filling said second channel and the area above said mesa and between said reformed third conductive layer, with an insulating material to form an insulating wall around and over said shielded conductor, and coating said third conductive layer and the surface of the last recited insulating material to form a continuous fourth conductive layer in substantially continuous electrical contact with said third conductive layer.

5. Process of making a shielded etched circuit conductor comprising the steps of providing a multilayer laminated structure having a continuous first conductive layer, a continuous first etch-resistant conductive layer on said first conductive layer, a continuous second conductive layer in substantially continuous electrical contact with said first conductive layer, and a first photosensitive etch-resistant layer on said second conductive layer, exposing said first photosensitive layer through a positive image of a shielded conductor pattern, removing the unexposed portion of said first photosensitive layer to uncover said second conductive layer, over-etching the uncovered area of said second conductive layer to produce a first channel substantially wider than said area, removing the exposed portion of said first photosensitive layer, filling said first channel with an etch-resistant insulating material, forming a second etch-resistant conductive layer on said second conductive layer, forming a continuous third conductive layer on said second etch-resistant layer and the surface of the insulating material in said first channel, said third conductive layer being in substantially continuous electrical contact with said second conductive layer, forming a second photosensitive etch-resistant layer on said third conductive layer, exposing said second photosensitive layer through a negative image of said shielded conductor pattern, said negative image being substantially in register with said positive image, removing the unexposed portion of said second photosensitive layer to uncover said third conductive layer, over-etching the uncovered area to remove a peripheral portion of said third conductive layer above said insulating material in said channel, leaving a conductive mesa substantially narrower than said area, removing the exposed portion of said second photosensitive layer, coating the exposed surface peripheral to said first channel to reform said third conductive layer and to increase the thickness of said layer to form a second channel between said layer and said mesa, filling said second channel and the area above said mesa and between said reformed third conductive layer with an insulating material, and forming a fourth conductive layer on the last recited insulating material and in substantially continuous electrical contact with said third conductive layer.

6. Process of making a shielded etched circuit conductor comprising the steps of providing a multilayer laminated structure having a continuous first conductive layer, a continuous first etch-resistant conductive layer on said first conductive layer, and a continuous second conductive layer in ssubstantially continuous electrical contact with said first conductive layer, forming a first etch-resistant mask on said second conductive layer, said mask covering areas of said layer outside a shielded conductor pattern, over-etching the unmasked area of said second conductive layer to produce a first channel substantially wider than the shielded conductor of said pattern, removing said first etch-resistant mask, filling said first channel with an etch-resistant insulating material, forming a second etch-resistant conductive layer on said second conductive layer, forming a continuous third conductive layer on said second etch-resistant layer and on the surface of the insulating material in said first channel, said third conductive layer being in substantially continuous electrical contact with said second conductive layer, forming a second etch-resistant mask on said third conductive layer, said mask covering areas of said layer corresponding to the shielded conductor of said pattern, over-etching said third conductive layer to remove the unmasked portion thereof overlying the insulating material in said channel, leaving a conductive mesa substantially narrower than the shielded conductor of said pattern, removing said second etch-resistant mask, coating the exposed surface peripheral to said first channel to reform said third conductive layer and to increase the thickness of said layer to form a second channel between said layer and said mesa, filling said second channel and the area above said mesa and between said reformed third conductive layer with an etch-resistant insulating material, and forming a fourth conductive layer on the last recited insulating material and in substantially continuous electrical contact with said third conductive layer.

7. Process of making a shielded etched circuit conductor comprising the steps of providing a multilayer laminated structure having a continuous first conductive layer, a continuous first etch-resistant layer on said first conductive layer, and a continuous second conductive layer in substantially continuous electrical contact with said first conductive layer, etching said second conductive layer to produce therein a first channel corresponding to a shielded conductor pattern and substantially wider than the conductor of said pattern, filling said first channel with an insulating material, forming a second etch-resistant conductive layer on said second conductive layer, forming a continuous third conductive layer on said second etch-resistant layer and on the surface of said insulating material, said third conductive layer being in substantially continuous electrical contact with said second conductive layer, etching said third conductive layer to produce a conductive mesa on the insulating material in said channel, said mesa being substantially electrically insulated from the conductive material of said second conductive layer, coating the exposed surface peripheral to the insulating material in said first channel to reform said third conductive layer and to increase the thickness of said layer beyond that of said mesa, forming a second channel between said mesa and said third layer, filling said second channel and the area above said mesa and between said reformed third conductive layer with an insulating material, and forming a fourth conductive layer on the last recited insulating material and in substantially continuous electrical contact with the portion of said reformed third conductive layer surrounding said mesa.

8. Process of forming on etched circuit conductor electrically insulated from an underlying conductive layer, comprising the steps of providing a laminated structure having a first conductive layer, a first etch-resistant layer on said first conductive layer, and a second conductive layer on said first conductive layer, etching said second conductive layer to produce therein a channel corresponding to a conductor pattern and substantially wider than the conductor of said pattern, filling said channel with insulating material, forming a second etch-resistant layer on said second conductive layer, forming a third conductive layer on said second etch-resistant layer and on the surface of said insulating material, and etching said third conductive layer to produce a conductive mesa on the insulating material in said channel, said mesa being substantially electrically insulated from said first and second conductive layers.

9. Process of forming an electrically insulated etched circuit conductor comprising the steps of providing a laminated structure having an etch-resistant base and a first conductive layer, etching said first conductive layer to form therein a channel corresponding to a conductor pattern and substantially wider than the conductor of said pattern, filling said channel with insulating material, forming an etch-resistant layer on said first conductive layer, forming a second conductive layer on said etch-resistant layer and on the surface of said insulating material, and etching said second conductive layer to produce a conductive mesa on the insulating material in said channel, said mesa being substantially electrically insulated from said first conductive layer.

10. Process of making a shielded etched circuit conductor comprising the steps of providing a multilayer laminated structure having a continuous first conductive layer, etching a termination pad pattern in said first conductive layer, coating the surface of said first layer to form a first etch-resistant conductive layer, plating said first etch-resistant layer to form a continuous second conductive layer, coating said second conductive layer with photoengraving emulsion to form a first emulsion layer, exposing said first emulsion layer through a positive image of a shielded conductor pattern, removing the unexposed emulsion of said first emulsion layer to uncover said second conductive layer, over-etching the uncovered area of said second conductive layer to produce a first channel substantially wider than said area, removing the exposed emulsion of said first emulsion layer, filling said first channel with an etch-resistant insulating material, coating said second conductive layer to form a second etch-resistant conductive layer, sensitizing the surface of the insulating material in said channel, coating said second etch-resistant layer and said sensitized surface to form a continuous third conductive layer, coating said third conductive layer with a photoengraving emulsion to form a second emulsion layer, exposing said second emulsion layer through a negative image of said shielded conductor pattern, removing the unexposed emulsion of said second emulsion layer to uncover said third conductive layer, over-etching the uncovered area to remove said third conductive layer above said material in said channel, leaving a conductive mesa substantially narrower than said area, removing the exposed emulsion of said second emulsion layer, coating said second etch-resistant layer with a fourth conductive layer to form a second channel around and deeper than the height of said mesa, filling said second channel and the area above said mesa and between said fourth conductive layer, with an etch-resistant insulating material, sensitizing the surface of the last recited insulating material, coating said fourth conductive layer and said sensitized surface to form a continuous fifth conductive layer, and etching a termination pad pattern in said fifth conductive layer.

11. Process of making a printed circuit comprising the steps of providing a multilayer laminated structure having a first conductive layer, forming a channel in said first conductive layer, said channel corresponding to a printed circuit conductor pattern and being substantially wider than the conductor of said pattern, filling said channel with insulation, forming the printed circuit conductor of said pattern on the insulation in said channel, forming a second conductive layer on the portion of said first conductive layer peripheral to the insulation in said channel, said second conductive layer being thicker than said conductor, to form a second channel around said conductor with walls extending above the upper surface thereof, filling said second channel and the area above said conductor and between said second conductive layer with insulation, and forming a third conductive layer over said second conductive layer and over the last recited insulation.

12. Process of making a printed circuit comprising the steps of providing a multilayer laminated structure having a first conductive layer, forming a channel in said first conductive layer, said channel corresponding to a printed circuit conductor pattern and being substantially wider than the conductor of said pattern, filling said channel with insulation, forming the printed circuit conductor of said pattern on the insulation in said channel, forming a second conductive layer on the portion of said first conductive layer peripheral to the insulation in said channel, said second conductive layer being thicker than said conductor, to form a second channel around said conductor with walls extending above the upper surface thereof, filling said second channel and the area above said conductor and between said second conductive layer with insulation, forming a third conductive layer over said second conductive layer and over the last recited insulation, forming a third channel in said third conductive layer, said third channel corresponding to said printed circuit conductor pattern, filling said third channel with insulation, and forming a fourth conductive layer over said third conductive layer and over the insulation in said third channel.

13. Process of making a shielded etched circuit conductor comprising the steps of providing a multilayer laminated structure having a continuous first conductive layer, a continuous first etch-resistant conductive layer on said first conductive layer, and a continuous second conductive layer in substantially continuous electrical contact with said first conductive layer, forming a first etch-resistant mask on said second conductive layer, said mask covering areas of said layer outside a shielded conductor pattern, over-etching the unmasked area of said second conductive layer to produce a first channel substantially wider than the shielded conductor of said pattern, removing said first etch-resistant mask, filling said first channel with an etch-resistant insulating material, forming a second etch-resistant conductive layer on said second conductive layer, forming a continuous third conductive layer on said second etch-resistant layer and on the surface of the insulating material in said first channel, said third conductive layer being in substantially continuous electrical contact with said second conductive layer, forming a second etch-resistant mask on said third conductive layer, said mask covering areas of said layer corresponding to the shielded conductor of said pattern, over-etching said third conductive layer to remove the unmasked portion thereof overlying the insulating material in said channel, leaving a conductive mesa substantially narrower than the shielded conductor of said pattern, removing said second etch-resistant mask, coating the exposed surface peripheral to said first channel to reform said third conductive layer and to increase the thickness of said layer to form a second channel between said layer and said mesa, filling said second channel and the area above said mesa and between said reformed third conductive layer with an etch-resistant insulating material, forming a fourth conductive layer on the last recited insulating material and in substantially continuous electrical contact with said third conductive layer, forming a third etch-resistant mask on said fourth conductive layer, said mask covering areas of said layer outside of said shielded conductor of said pattern, etching the unmasked area of said fourth conductive layer to produce a third channel, removing said third etch-resistant mask, filling said third channel with an insulating material, and forming a fifth conductive layer on the insulating material in said third channel and in substantially continuous electrical contact with said fourth conductive layer.

14. Process of making a shielded etched circuit conductor comprising the steps of providing a multilayer laminated structure having a base member, a continuous first conductive layer on said base member, a continuous first etch-resistant conductive layer on said first conductive layer, a continuous second conductive layer on said first etch-resistant layer, and a first photosensitive etch-resistant layer on said second conductive layer, exposing said first photosensitive layer through a positive image of a shielded conductor pattern, removing the unexposed portion of said first photosensitive layer to uncover the portions of said second conductive layer corresponding to the shielded conductor of said pattern, over-etching the uncovered area of said second conductive layer to produce a first channel substantially wider than said conductor, removing the exposed portion of said first photosensitive layer, filling said first channel with an etch-resistant insulating material to form an insulating base for a narrower shielded conductor, forming a second etch-resistant conductive layer on said second conductive layer, forming a continuous third conductive layer on said second etch-resistant layer and the surface of the insulating material in said first channel, forming a second photosensitive etch-resistant layer on said third conductive layer, exposing said second photosensitive layer through a negative image of said shielded conductor pattern, said negative image being substantially in register with said positive image, removing the unexposed portion of said second photosensitive layer to uncover a portion of said third conductive layer corresponding to areas peripheral to said shielded conductor, etching the uncovered area to remove a peripheral portion of said third conductive layer above said insulating material in said channel, leaving a conductive mesa substantially narrower than said area, removing the exposed portion of said second photosensitive layer, coating the exposed conductive surface peripheral to said first channel to reform said third conductive layer and to increase the thickness of said layer beyond that of the portion forming said mesa, forming a second channel between said layer and said mesa, filling said second channel and the area above said mesa and between said reformed third conductive layer with an insulating material to form an insulating wall around and over said shielded conductor, coating said third conductive layer and the surface of the last recited insulating material to form a continuous fourth conductive layer in substantially continuous electrical contact with said third conductive layer, forming a third photosensitive etch-resistant layer on said fourth conductive layer, exposing said third photosensitive layer through a positive image of said shielded conductor pattern, said positive image being substantially in register with said previous positive image, removing the unexposed portion of said third photosensitive layer to uncover a portion of said fourth conductive layer corresponding to said shielded conductor, etching the uncovered area of said fourth conductive layer to produce a third channel, removing the exposed portion of said third photosensitive layer, filling said third channel with an insulating material, and coating said fourth conductive layer and the insulating material in said third channel to form a fifth conductive layer in substantially continuous electrical contact with said fourth conductive layer.

References Cited

UNITED STATES PATENTS

| | | | |
|---|---|---|---|
| 2,749,524 | 6/1956 | Derosa et al. | |
| 3,206,342 | 9/1965 | Briggs | 29—604 |
| 3,352,730 | 11/1967 | Murch | 29—625 X |
| 2,734,150 | 2/1956 | Beck | 29—155.5 |
| 3,169,892 | 2/1965 | Lemelson | 29—155.5 |

JOHN F. CAMPBELL, *Primary Examiner.*

C. E. HALL, *Assistant Examiner.*